(12) United States Patent
Tanaka

(10) Patent No.: US 8,466,022 B2
(45) Date of Patent: Jun. 18, 2013

(54) SEMICONDUCTOR MEMORY DEVICE AND METHOD FOR MANUFACTURING THE SAME

(75) Inventor: Masayuki Tanaka, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 288 days.

(21) Appl. No.: 13/052,456

(22) Filed: Mar. 21, 2011

(65) Prior Publication Data

US 2011/0316066 A1 Dec. 29, 2011

(30) Foreign Application Priority Data

Jun. 25, 2010 (JP) ................. 2010-145450

(51) Int. Cl.
*H01L 21/336* (2006.01)
*H01L 29/792* (2006.01)

(52) U.S. Cl.
USPC ........... 438/264; 438/396; 438/594; 257/324; 257/326; 257/E29.309

(58) Field of Classification Search
USPC .................. 438/264, 396, 594; 257/324, 326, 257/E29.309
See application file for complete search history.

(56) References Cited

U.S. PATENT DOCUMENTS

| | | | | |
|---|---|---|---|---|
| 7,462,533 B2* | 12/2008 | Kim et al. | | 438/216 |
| 7,737,488 B2* | 6/2010 | Lai et al. | | 257/325 |
| 7,928,496 B2* | 4/2011 | Takeuchi et al. | | 257/316 |
| 7,956,406 B2* | 6/2011 | Yasuda | | 257/324 |
| 8,030,701 B2* | 10/2011 | Yasuda | | 257/326 |
| 8,237,217 B2* | 8/2012 | Yasuda | | 257/324 |

FOREIGN PATENT DOCUMENTS

JP 2003-203996 7/2003

* cited by examiner

*Primary Examiner* — Jarrett Stark
*Assistant Examiner* — Nicholas Tobergte
(74) *Attorney, Agent, or Firm* — Finnegan, Henderson, Farabow, Garrett & Dunner, L.L.P.

(57) ABSTRACT

According to one embodiment, a semiconductor memory device includes a semiconductor substrate, a tunnel insulating film, a first electrode, an interelectrode insulating film and a second electrode. The tunnel insulating film is provided on the semiconductor substrate. The first electrode is provided on the tunnel insulating film. The interelectrode insulating film is provided on the first electrode. The second electrode is provided on the interelectrode insulating film. The interelectrode insulating film includes a stacked insulating layer, a charge storage layer and a block insulating layer. The charge storage layer is provided on the stacked insulating layer. The block insulating layer is provided on the charge storage layer. The stacked insulating layer includes a first insulating layer, a quantum effect layer and a second insulating layer. The quantum effect layer is provided on the first insulating layer. The second insulating layer is provided on the quantum effect layer.

11 Claims, 11 Drawing Sheets

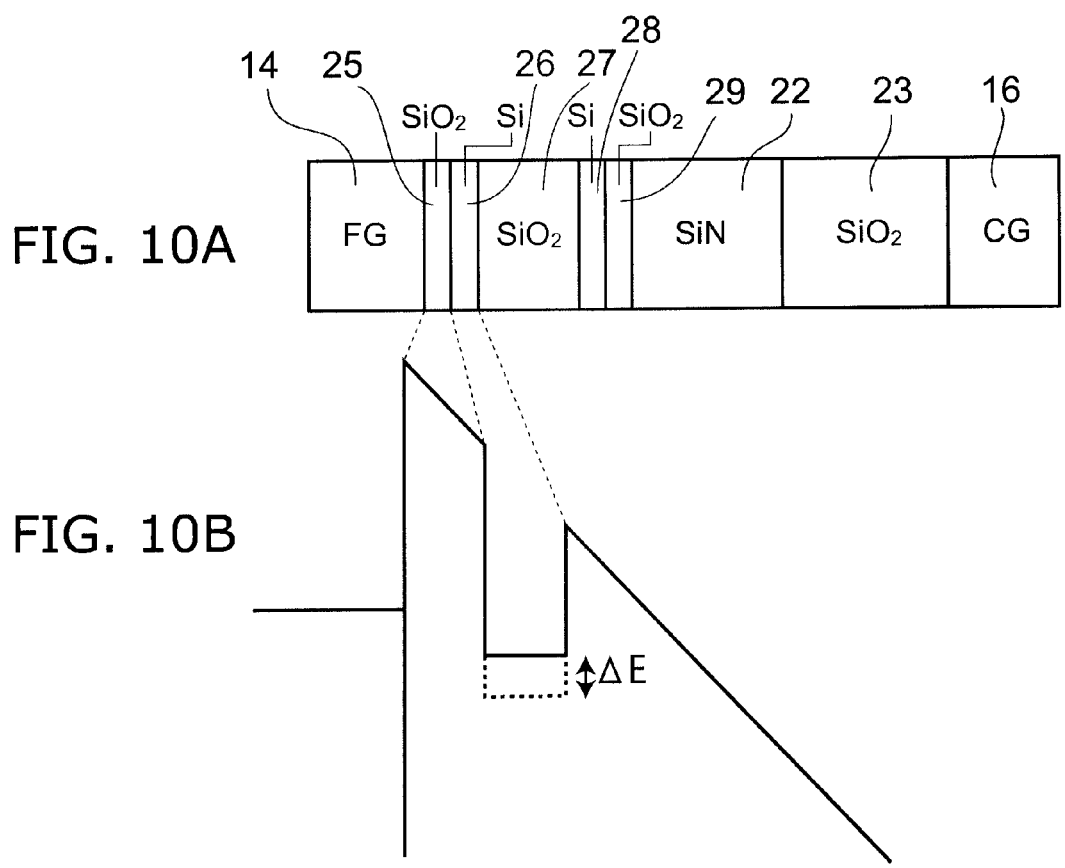

SEMICONDUCTOR MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2010-145450, filed on Jun. 25, 2010; the entire contents of which are incorporated herein by reference.

FIELD

Embodiments described herein relate generally to a semiconductor device and a method for manufacturing the same.

BACKGROUND

In conventional nonvolatile semiconductor memory devices of a floating gate electrode type, with the miniaturization of memory cells, the number of electrons accumulated in a floating gate electrode reduces. Accordingly, the leak of one electron among electrons accumulated in the floating gate electrode causes a large variation of the threshold value of a memory cell transistor, which is a factor of the deterioration of operation reliability. Moreover, the decrease in the interval between adjacent memory cells increases the interference due to capacity coupling, which causes the increase in a program time and an erase time and is a factor of the deterioration of the device characteristics.

BRIEF DESCRIPTION OF THE DRAWINGS

FIG. 10A is a view schematically illustrating the interelectrode insulating film and surrounding parts thereof in the first embodiment, and 10B is energy band a diagram in program operation;

DETAILED DESCRIPTION

In general, according to one embodiment, a semiconductor memory device includes a semiconductor substrate, a tunnel insulating film, a first electrode, an interelectrode insulating film and a second electrode. The tunnel insulating film is provided on the semiconductor substrate. The first electrode is provided on the tunnel insulating film. The interelectrode insulating film is provided on the first electrode. The second electrode is provided on the interelectrode insulating film. The interelectrode insulating film includes a stacked insulating layer, a charge storage layer and a block insulating layer. The charge storage layer is provided on the stacked insulating layer and has a lower barrier height than the stacked insulating layer. The block insulating layer is provided on the charge storage layer and has a higher barrier height than the charge storage layer. The stacked insulating layer includes a first insulating layer, a quantum effect layer and a second insulating layer. The quantum effect layer is provided on the first insulating layer and has a lower barrier height than the first insulating layer. The second insulating layer is provided on the quantum effect layer and has a higher barrier height than the quantum effect layer.

In general, according to another embodiment, a method is disclosed for manufacturing a semiconductor memory device. The method can include forming a stacked body of a tunnel insulating film, a first electrode, an interelectrode insulating film and a second electrode sequentially stacked on a semiconductor substrate. The forming the stacked body includes forming a stacked insulating layer on the first electrode, forming a charge storage layer having a lower barrier height than the stacked insulating layer on the stacked insulating layer, and forming a block insulating layer having a higher barrier height than the charge storage layer on the charge storage layer. The forming the stacked insulating layer includes forming a first insulating layer on the first electrode, forming a quantum effect layer having a lower barrier height than the first insulating layer on the first insulating layer, and forming a second insulating layer having a higher barrier height than the quantum effect layer on the quantum effect layer.

Various embodiments will be described hereinafter with reference to the accompanying drawings.

First, a first embodiment will be described.

Figure 1:
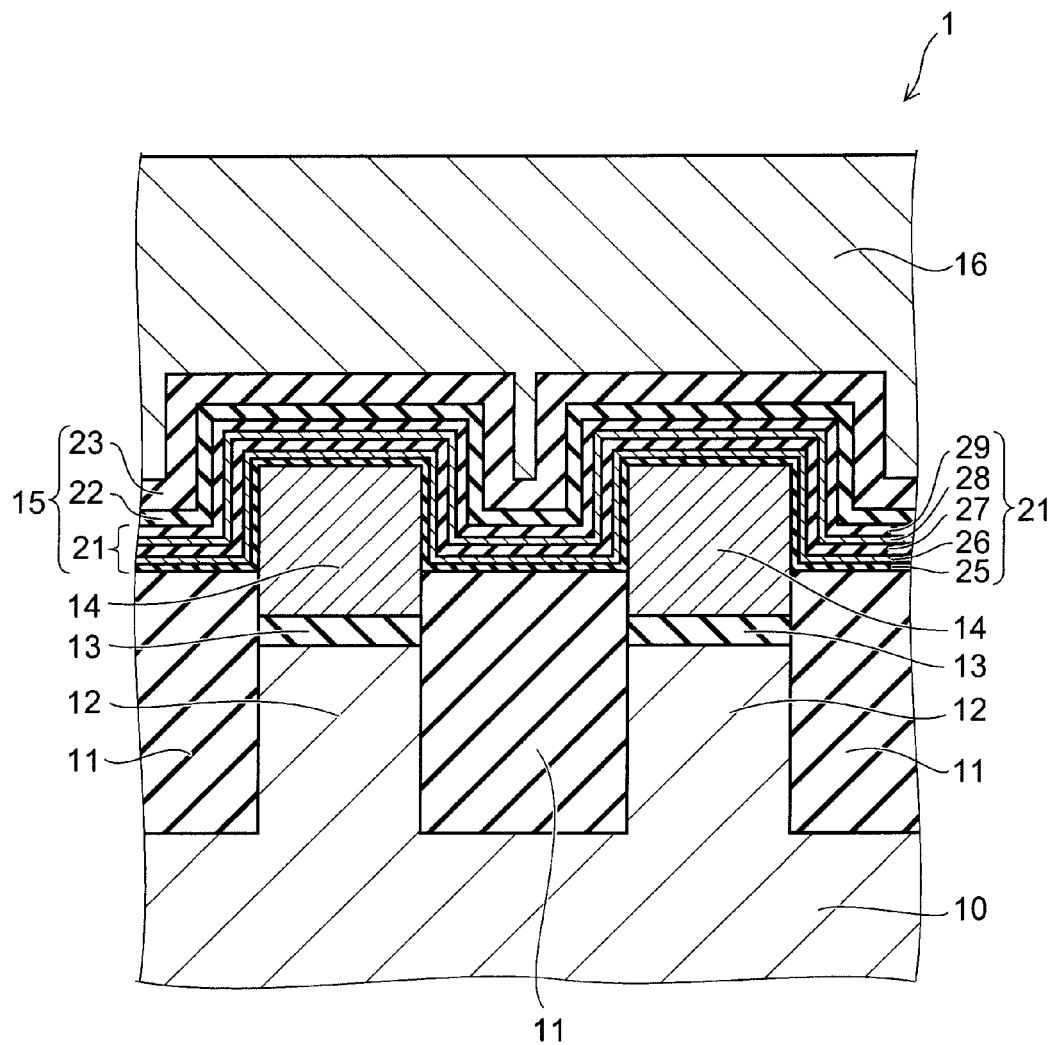
FIGS. 1 and 2 are cross-sectional views illustrating a semiconductor memory device according to a first embodiment.
Figure 2:
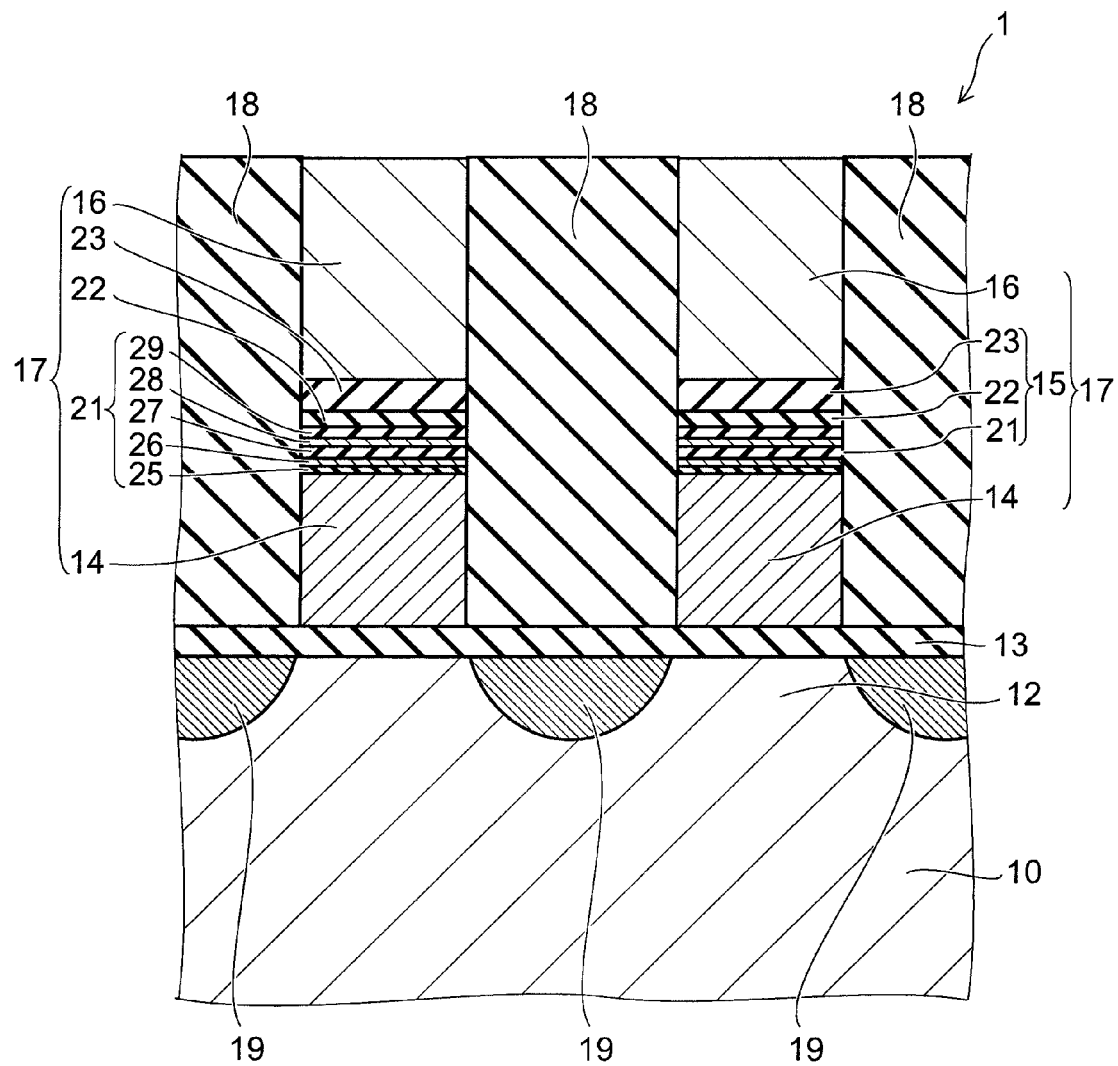

FIGS. 1 and 2 are cross-sectional views illustrating a semiconductor memory device according to the embodiment, which show cross-sections perpendicular to each other.

Figure 3:
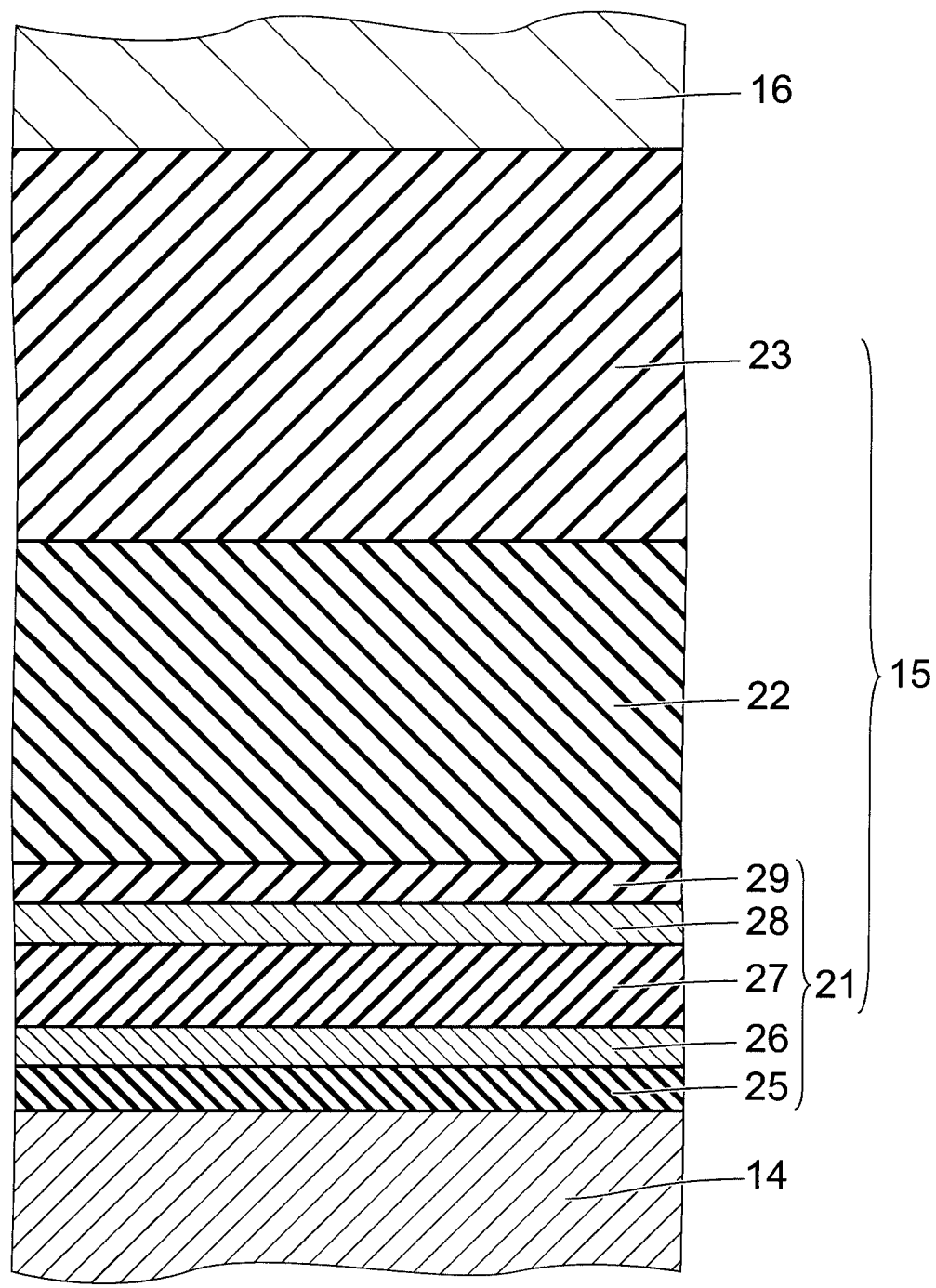
FIG. 3 is a cross-sectional view illustrating an interelectrode insulating film in the first embodiment.

FIG. 3 is a cross-sectional view illustrating an interelectrode insulating film in the embodiment.

First, the characteristic part of the embodiment will be described roughly.

The semiconductor memory device according to the embodiment is a nonvolatile semiconductor memory device of an NAND type. In the device, a charge storage layer constituted of silicon nitride is provided in the interelectrode insulating film provided between the floating gate electrode and a control gate electrode. This makes it possible to accumulate charges in the charge storage layer in addition to the floating gate electrode. In the interelectrode insulating film, for a part placed between the charge storage layer and the floating gate electrode, that is, a part through which electrons pass, two thin silicon layers are provided in a silicon oxide layer. For electrons, the barrier height of a silicon layer is lower than the barrier height of a silicon oxide layer. Consequently, when a strong electric field is applied to the interelectrode insulating film, more tunneling currents flow by using the silicon layer as a relay part. This makes programming/erasing characteristics high. Moreover, each of these silicon layers is thin to such a degree that a quantum effect is exerted. Therefore, when an electric field is scarcely applied to the interelectrode insulating film, the quantum confinement effect for electrons raises the lower end of the conduction band of the silicon layer. Accordingly, charges accumulated in the charge storage layer have high charge retention characteristics. Thus, the embodiment can realize a semiconductor memory device having high programming/erasing characteristics and a high operational reliability.

Hereinafter, the semiconductor memory device according to the embodiment will be described in detail.

As shown in FIGS. 1 and 2, a semiconductor memory device 1 according to the embodiment is provided with a semiconductor substrate 10. The semiconductor substrate 10 is, for example, a silicon substrate having a p-type conduction property. Or, it may be a substrate having a p-type well in an upper layer part of an n-type silicon substrate. In a part of the upper layer part of the semiconductor substrate 10, plural element isolation insulators 11 constituted, for example, of a silicon oxide and extending in one direction are formed at even intervals, and the upper layer part of the semiconductor substrate 10 is partitioned by the element isolation insulators 11 into plural active areas 12 extending in one direction. The upper part of the element isolation insulator 11 protrudes from the upper surface of the semiconductor substrate 10. That is, the upper surface of the element isolation insulator 11 is positioned higher than the upper surface of the active area 12. Hereinafter, the direction in which the element isolation insulator 11 and the active area 12 extend is denoted by a "bit line direction," and the direction in which the element isolation insulator 11 and the active area 12 are aligned is denoted by a "word line direction." And, the direction perpendicular to the upper surface of the semiconductor substrate 10 is denoted by a "top and bottom direction." The bit line direction, the word line direction and the top and bottom direction are perpendicular to one another.

In a region directly above the active area 12, a tunnel insulating film 13 constituted, for example, of silicon oxide is provided. The tunnel insulating film 13 is usually insulative, but is a film that allows a tunneling current to flow when a prescribed voltage within the range of the drive voltage of the semiconductor memory device 1 is applied. The tunnel insulating film 13 abuts on the active area 12, and extends in the bit line direction in the same manner as the active area 12.

In a part of the region directly above the tunnel insulating film 13, a floating gate electrode (FG electrode) 14 constituted of a metal is provided. The FG electrodes 14 are provided intermittently in the region directly above one active area 12 along the bit line direction, and in the semiconductor memory device 1 as a whole, they are arranged in a matrix shape along both bit line direction and word line direction. Lower parts of respective FG electrodes 14 are positioned between the element isolation insulators 11, and upper parts thereof protrude from the upper surface of the element isolation insulator 11.

On the element isolation insulator 11 and on the FG electrode 14, an interelectrode insulating film 15 is provided. The interelectrode insulating film 15 extends in the word line direction so as to connect regions directly above FG electrodes 14. When seen from the bit line direction, the shape of the interelectrode insulating film 15 snakes as waves, while reflecting that the upper surface of the FG electrode 14 protrudes from the upper surface of the element isolation insulator 11. On the interelectrode insulating film 15, a control gate electrode (CG electrode) 16 constituted of a metal is provided. The CG electrode 16, too, extends in the word line direction so as to connect regions directly above FG electrodes 14, as is the case for the interelectrode insulating film 15. For the lower surface of the CG electrode 16, irregularity reflecting the shape of the interelectrode insulating film 15 is formed. The FG electrode 14 is insulated from the CG electrode 16 by the interelectrode insulating film 15.

And, plural FG electrodes 14 arranged along the word line direction, and respective one interelectrode insulating film 15 and CG electrode 16 provided so as to connect regions directly above FG electrodes 14 constitute one stacked body 17. The stacked body 17 has a shape of a plate extending in the word line direction. Between stacked bodies 17 on the tunnel insulating film 13, an interlayer insulating film 18 constituted, for example, of silicon oxide is provided. Moreover, in parts lying between regions directly below stacked bodies 17 within the active area 12, a source/drain region 19 having an n-type conduction property is formed.

Hereinafter, the structure of the interelectrode insulating film 15 will be described in detail.

As shown in FIG. 3, in the interelectrode insulating film 15, a stacked insulating layer 21, a charge storage layer 22 and a block insulating layer 23 are stacked in this order from the bottom side. The stacked insulating layer 21 is a film that is insulative usually, but allows a tunneling current to flow when a prescribed voltage within the range of the drive voltage of the semiconductor memory device 1 is applied. The charge storage layer 22 is a layer having a capacity of accumulating charges, and a layer having many charge trap sites formed. The charge storage layer 22 is preferably formed from a material having a relative permittivity of 7 or more. The charge storage layer 22 is formed, for example, from silicon nitride.

The block insulating layer 23 is a layer for insulating the charge storage layer 22 from the CG electrode 16. The block insulating layer 23 is a layer that substantially does not allow a current to flow even when a voltage within the range of the drive voltage of the semiconductor memory device 1 is applied, and is formed, for example, from silicon oxide. The band gap of the charge storage layer 22 is narrower than band gaps of the stacked insulating layer 21 and the block insulating layer 23 and, therefore, the barrier height of the charge storage layer 22 for electrons is lower than the barrier heights of the stacked insulating layer 21 and the block insulating layer 23 for electrons.

In the stacked insulating layer 21, a silicon oxide layer 25, a silicon layer 26, a silicon oxide layer 27, a silicon layer 28 and a silicon oxide layer 29 are stacked in this order from the bottom side. The silicon layers 26 and 28 may have an amorphous structure or a polycrystalline structure. More on, they may have a structure constituted of the three-dimensional aggregation of silicon fine particles (silicon dots). Band gaps of silicon layers 26 and 28 are narrower than band gaps of silicon oxide layers 25, 27 and 29, and, therefore, for electrons, barrier heights of silicon layers 26 and 28 are lower than barrier heights of silicon oxide layers 25, 27 and 29. Thicknesses of silicon layers 26 and 28 are thin to such a degree that the quantum effect is expressed, and are, for example, 1 to 2 nm or less, or, for example, 1 nm or less. Thicknesses of silicon oxide layers 25 and 27 are thin to such a degree that allows a tunneling current to flow easily, and are, for example, 3 nm or less, or, for example, 1 nm or less.

Hereinafter, there will be given examples of thicknesses of respective layers.

With regard to the interelectrode insulating film, in the stacked insulating layer 21, the silicon oxide layer 25 has a thickness of 0.8 nm, the silicon layer 26 has a thickness of 0.5 nm, the silicon oxide layer 27 has a thickness of 0.8 nm, the silicon layer 28 has a thickness of 0.5 nm, and the silicon oxide layer 29 has a thickness of 0.8 nm. The charge storage layer 22 has a thickness of 1 to 5 nm, and the block insulating layer 23 has a thickness of 3 to 4 nm. The tunnel insulating film 13 has a thickness of 1 to 15 nm, and the FG electrode 14 has a thickness of 10 to 50 nm.

Next, a method for manufacturing the semiconductor memory device according to the embodiment will be described.

FIGS. 4 to 9 are process cross-sectional views illustrating the method for manufacturing the semiconductor memory device according to the embodiment.

Figure 4:
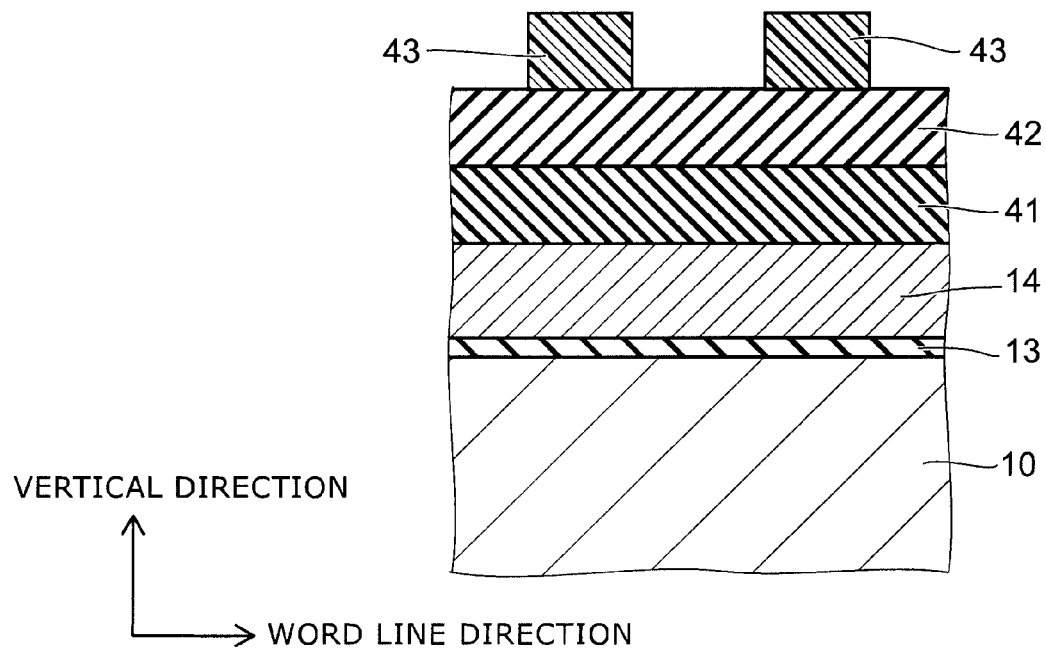
FIGS. 4 to 9 are process cross-sectional views illustrating a method for manufacturing the semiconductor memory device according to the first embodiment.

First, as shown in FIG. 4, a semiconductor substrate 10 that is of a p-type at least in the upper layer part is prepared. Next, on the semiconductor substrate 10, for example, silicon oxide is deposited in a thickness of 1 to 15 nm, thereby forming the tunnel insulating film 13. Meanwhile, in the stage, the tunnel insulating film 13 has not been divided, but is formed continuously on the semiconductor substrate 10. Next, for example, by a CVD (chemical vapor deposition) method, a metal is deposited in a thickness of 10 to 50 nm, thereby forming the floating gate electrode (FG electrode) 14. The FG electrode 14, too, has not been divided into the shape of a matrix, and is formed as one continuous film.

Next, for example, by the CVD method, silicon nitride is deposited in a thickness of 50 to 200 nm, thereby forming a silicon nitride film 41. Next, for example, by the CVD method, silicon oxide is deposited in a thickness of 50 to 400 nm, thereby forming a silicon oxide film 42. Next, on the silicon oxide film 42, a photoresist is coated, thereby forming a resist film, which is patterned by exposure drawing, thereby forming a resist pattern 43. The resist pattern 43 is formed in a line and space shape extending in the bit line direction.

Figure 5:
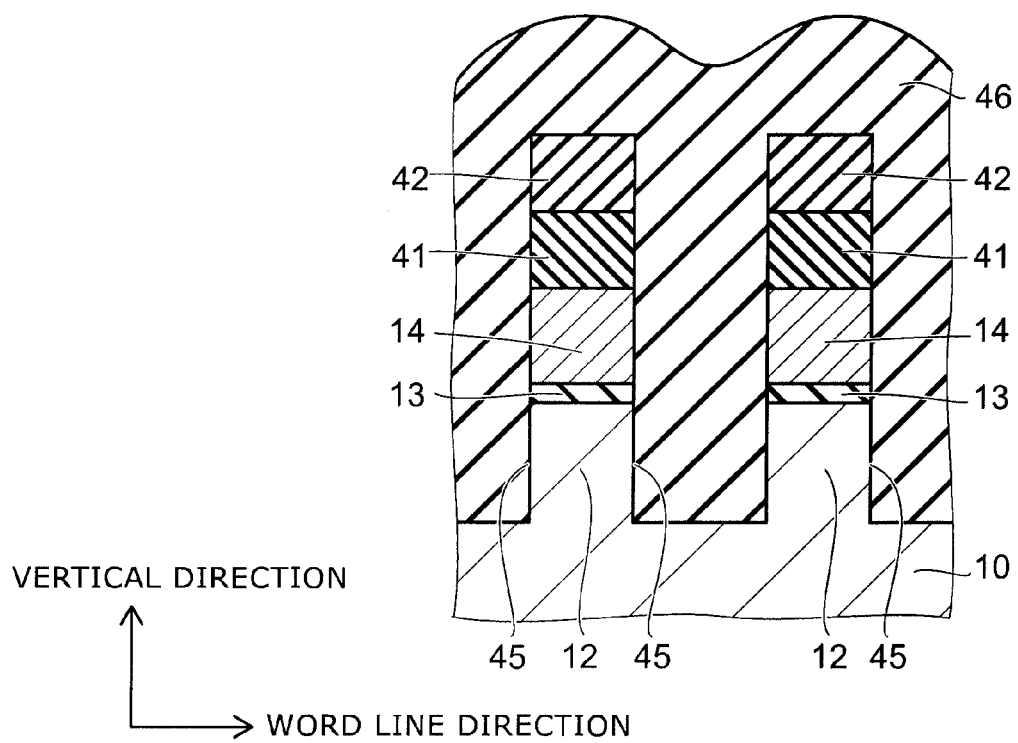

Next, as shown in FIG. 5, etching is carried out using the resist pattern 43 (see FIG. 4) as an etching-resistant mask, thereby patterning the silicon oxide film 42. After that, the resist pattern 43 is removed. Next, using the patterned silicon oxide film 42 as a mask, etching is carried out, thereby removing selectively the silicon nitride film 41, the FG electrode 14, the tunnel insulating film 13 and the upper layer part of the semiconductor substrate 10. This divides the silicon nitride film 41, the FG electrode 14 and the tunnel insulating film 13 into plural lines extending in the bit line direction, and plural trenches 45 extending in the bit line direction are formed in the upper layer part of the semiconductor substrate 10. In the upper layer part of the semiconductor substrate 10, a part sandwiched between trenches 45 works as the active area 12. Next, a silicon oxide film 46 having a thickness of 200 to 1500 nm is formed, for example, by a coating method so as to be embedded into the trench 45 and parts between divided tunnel insulating films 13, FG electrodes 14 and silicon nitride films 41, respectively.

Figure 6:
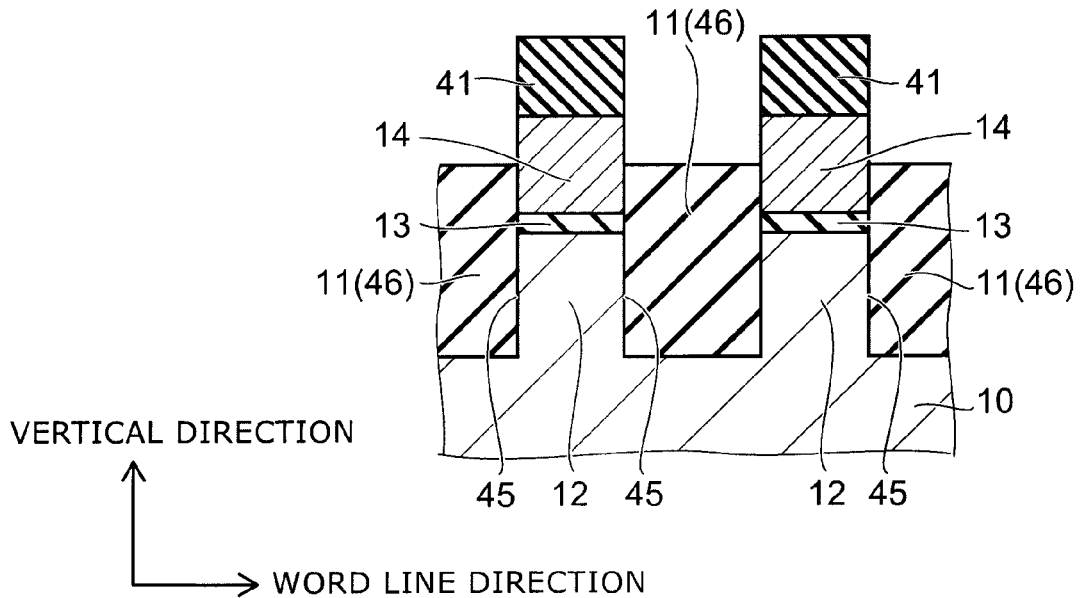

Next, as shown in FIG. 6, the silicon oxide film 46 and the silicon oxide film 42 (see FIG. 5) are subjected to CMP (chemical mechanical polishing) using the silicon nitride film 41 as a stopper, thereby flattening the upper surface. On this occasion, the silicon oxide film 42 (see FIG. 5), too, is removed with the upper part of the silicon oxide film 46. Next, by carrying out etching under a condition capable of attaining a selection ratio relative to the silicon nitride film 41, the silicon oxide film 46 is etched back, thereby retreating the upper surface of the silicon oxide film 46 to a position lower than the upper surface of the FG electrode 14 and higher than the lower surface of the FG electrode 14. This leaves the silicon oxide film 46 only in the trench 45, between the divided tunnel insulating films 13, and between the divided lower parts of the FG electrode 14, thereby constituting the element isolation insulator 11. After that, the silicon nitride film 41 is removed.

Figure 7:
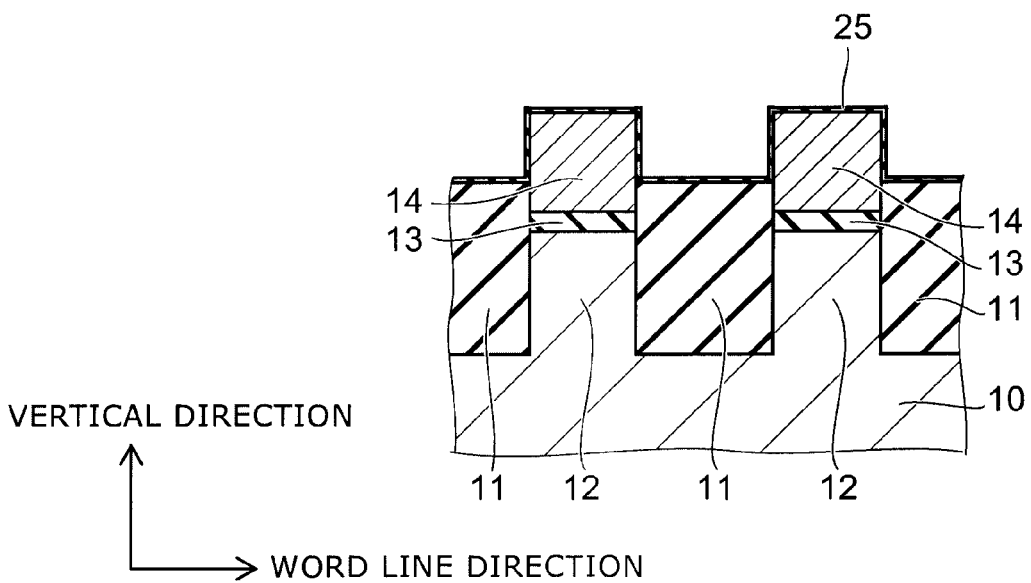

Next, as shown in FIG. 7, silicon oxide is deposited in a thickness of 0.8 nm on the element isolation insulator 11 and the FG electrode 14, for example, by an ALD (atomic layer deposition) method using trisdimethylaminosilane and ozone as raw material gases at temperature set at 550° C., thereby forming the silicon oxide layer 25. Meanwhile, in the stage, the silicon oxide layer 25 has not been divided yet and is formed as one continuous layer that covers the upper surface of the element isolation insulator 11 and the upper surface of the FG electrode 14.

Figure 8:
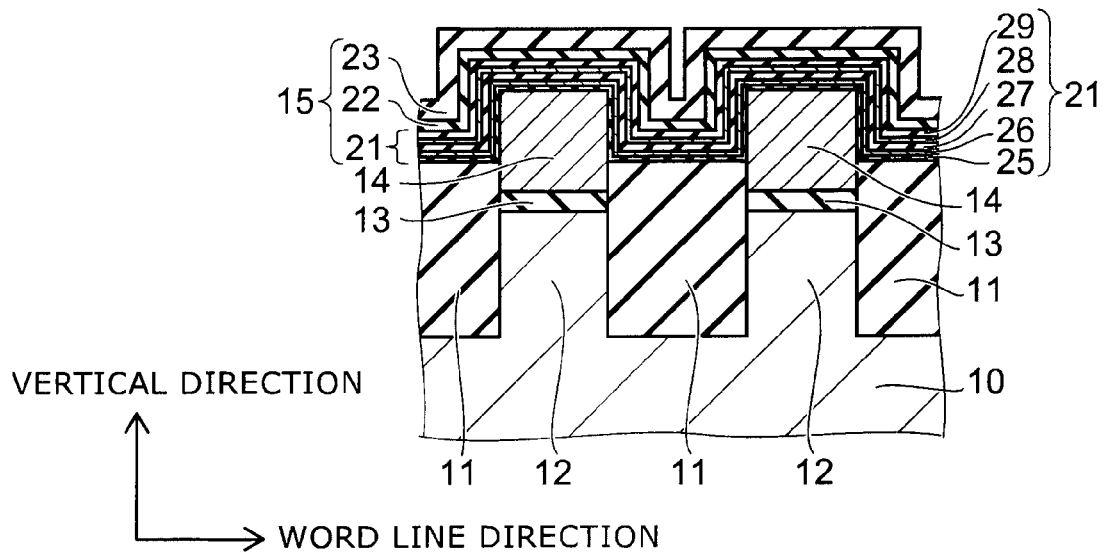

Next, as shown in FIG. 8, silicon is deposited in a thickness of 0.5 nm, for example, by a CVD method such as a LP-CVD (low pressure chemical vapor deposition) method using silane as a raw material gas at a temperature set at 500° C. This forms the silicon layer 26. Next, the silicon oxide layer 27 is formed by the same method as that for the silicon oxide layer 25 described above, the silicon layer 28 is formed by the same method as that for the silicon layer 26, and the silicon oxide layer 29 is formed by the same method as that for the silicon oxide layer 25. This forms the stacked insulating layer 21. Meanwhile, after the formation of respective silicon oxide layer 25, silicon layer 26, silicon oxide layer 27, silicon layer 28 and silicon oxide layer 29, a heating treatment or an oxidation treatment may be carried out. Such treatment increases the film density, restores defects, links unlinked hands and eliminates impurities, thereby improving the quality of respective layers.

Next, on the stacked insulating layer 21, for example, silicon nitride is deposited in a thickness of 1 to 5 nm, thereby forming the charge storage layer 22. Next, on the charge storage layer 22, for example, silicon oxide is deposited in a thickness of 3 to 4 nm, thereby forming the block insulating layer 23. This forms the interelectrode insulating film 15. In the stage, the interelectrode insulating film 15 has not been divided yet, and is formed in one continuous film.

Figure 9:
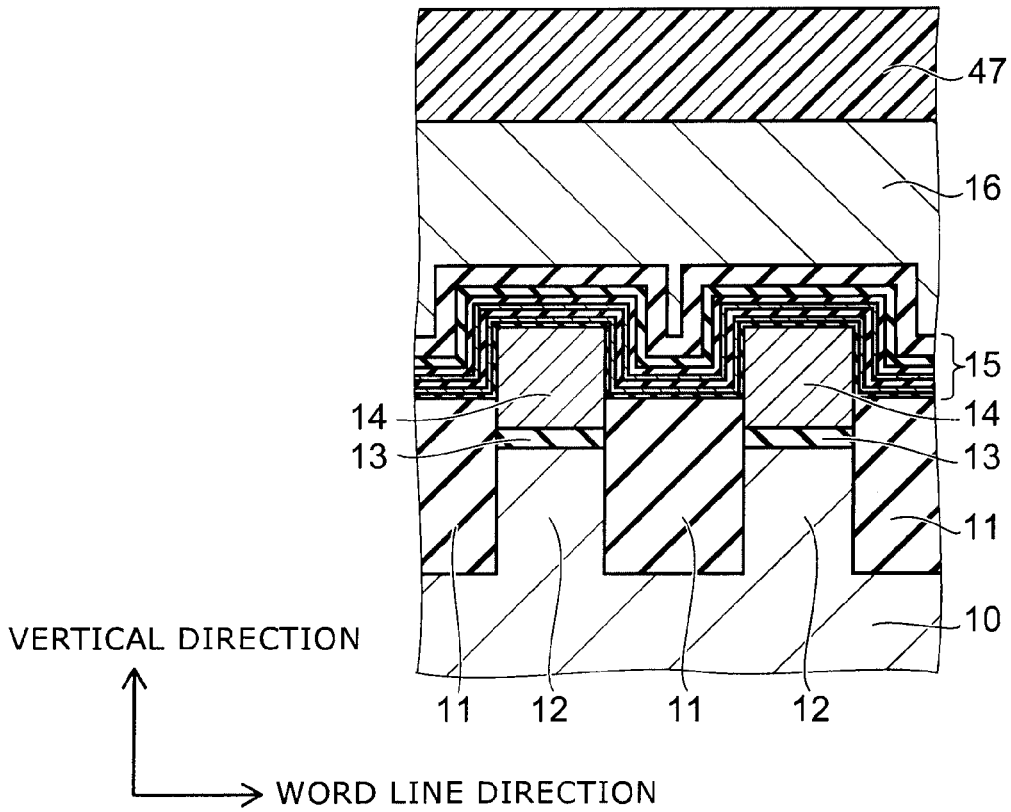

Next, as shown in FIG. 9, on the interelectrode insulating film 15, a metal is deposited, thereby forming the control gate electrode (CG electrode) 16. In the stage, the CG electrode 16, too, has not been divided yet and is one continuous film. Next, on the CG electrode 16, a resist film is formed and patterned by exposure drawing, thereby forming the resist pattern 47. The resist pattern 47 is formed as a pattern of a line and space shape extending in the word line direction.

Next, etching is carried out using the resist pattern 47 as a mask, thereby removing selectively the CG electrode 16, the interelectrode insulating film 15 and the FG electrode 14. This divides the CG electrode 16, the interelectrode insulating film 15 and the FG electrode 14 along the bit line direction, thereby forming the stacked body 17 (see FIG. 2). As the result, the CG electrode 16 and the interelectrode insulating film 15 have a shape of a line extending in the word line direction. Moreover, since the FG electrode 14 has already been divided in a line shape extending in the bit line direction in the process shown in FIG. 5, the electrode is divided along both bit line direction and word line direction by the etching and arranged in a matrix shape.

Next, as shown in FIGS. 1 and 2, using the stacked body 17 as a mask, an impurity to be a donor for the semiconductor substrate 10 is formed. This forms the source/drain region 19 having an n-type conductive property in parts lying between regions directly under stacked bodies 17 in the active area 12. After that, when the resist pattern 47 (see FIG. 9) remains, it is removed. Next, between stacked bodies 17, for example, silicon oxide is deposited, thereby forming the interlayer insulating film 18. After this, by an ordinary method, a contact (not shown) is formed in the interlayer insulating film 18, and upper layer wiring etc. (not shown) are formed on the interlayer insulating film 18. This produces the semiconductor memory device 1.

Next, the operation of the semiconductor memory device according to the embodiment will be described.

FIG. 10A is a view schematically illustrating the interelectrode insulating film and surrounding parts thereof in the embodiment, and 10B is a energy band diagram in program operation.

Figures 11A, 11B:
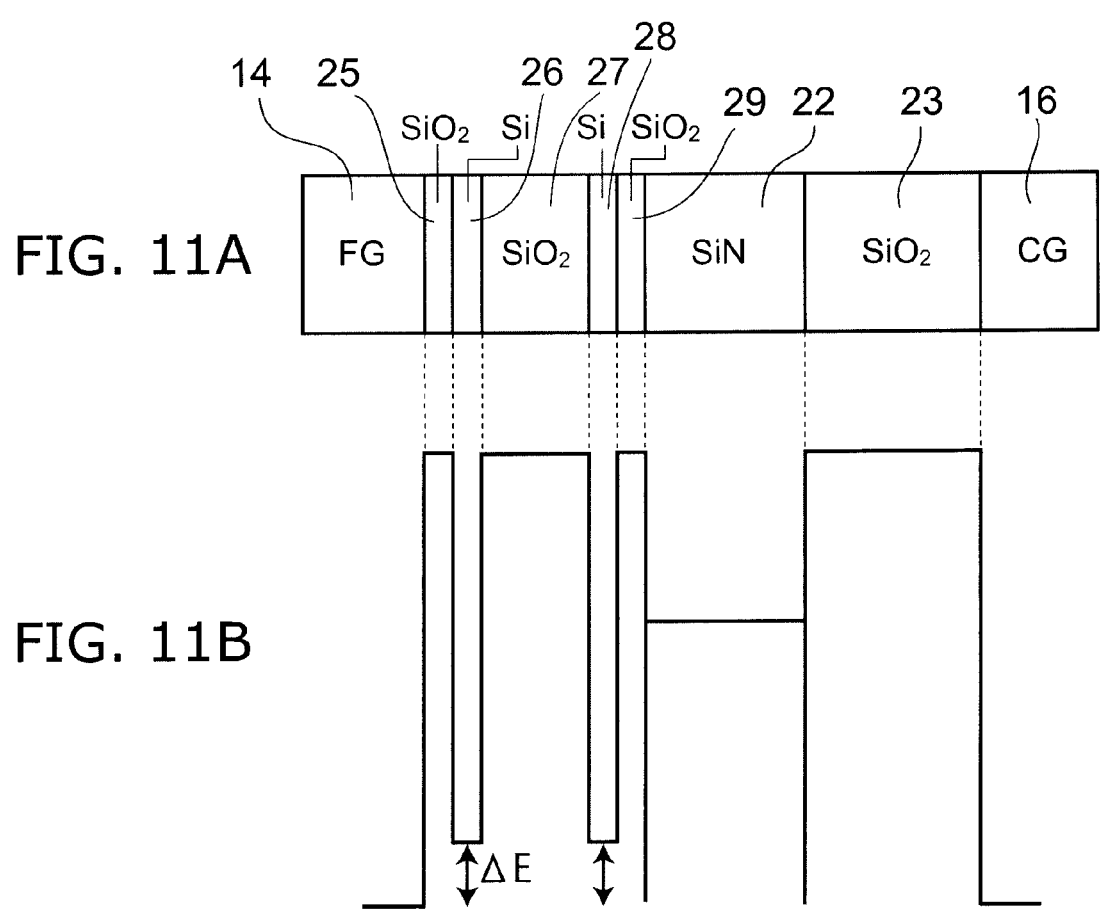
FIG. 11A is a view schematically illustrating the interelectrode insulating film and surrounding parts thereof in the first embodiment, and 11B is a energy band diagram during data-retention.

FIG. 11A is a view schematically illustrating the interelectrode insulating film and surrounding parts thereof in the embodiment, and 11B is a energy band diagram during data-retention.

In the semiconductor memory device 1, the memory cell transistor containing one FG electrode 14 is formed for every nearest point of the active area 12 and the CG electrode 16. When data is to be written into the memory cell transistor of the semiconductor memory device 1, the potential of the CG electrode 16 is set to be higher than the potential of the active area 12. This enables a tunneling current to flow through the tunnel insulating film 13, and electrons are injected into the FG electrode 14 from the active area 12 via the tunnel insulating film 13. Moreover, the tunneling current flows through the stacked insulating layer 21, too, and electrons are injected into the charge storage layer 22 from the FG electrode 14 via the stacked insulating layer 21.

On this occasion, as shown in FIGS. 10A and 10B, since the silicon layer 26 is provided on the FG electrode 14 side of the stacked insulating layer 21, an energy barrier constituted of silicon oxide layers 25 and 27 is split spatially by the silicon layer 26. Consequently, electrons tunnel two energy barriers of silicon oxide layers 25 and 27 utilizing the silicon layer 26 as a relay point. Consequently, as compared with a case where no silicon layer 26 is provided, the tunneling probability increases and the tunneling current increases. Meanwhile, since the energy levels of the silicon layer 28 and the silicon oxide layer 29 have largely been lowered by the application of a program voltage, the silicon layer 28 and the silicon oxide layer 29 have little influence on the tunneling current.

On the other hand, since the tunneling current substantially does not flow through the block insulating layer 23, electrons are not ejected from the charge storage layer 22 toward the CG electrode 16. As the result, charges are accumulated in the FG electrode 14 and the charge storage layer 22, and data are written. As described above, in the semiconductor memory device 1, since the stacked insulating layer 21 is provided with the silicon layer 26, the tunneling current is large when program voltage is applied between the active area 12 and the CG electrode 16, and the programming characteristics are good.

The FG electrode 14 is placed between the tunnel insulating film 13 and the interelectrode insulating film 15, and these films do not allow a tunneling current to flow when a prescribed voltage is not applied. Moreover, the charge storage layer 22 is placed between the stacked insulating layer 21 and the block insulating layer 23, and, since barrier heights of the stacked insulating layer 21 and the block insulating layer 23 are higher than the barrier height of the charge storage layer 22, electrons are kept in the charge storage layer 22 in a state where no electric field is applied. Consequently, if a voltage of a prescribed value or more is not applied between the active area 12 and the CG electrode 16, charges accumulated in the FG electrode 14 and the charge storage layer 22 are retained without change, and data written in the memory cell transistor can be retained.

On this occasion, as shown in FIGS. 11A and 11B, although silicon layers 26 and 28 having a low barrier height is provided for the stacked insulating layer 21, silicon layers 26 and 28 are thin to such a degree that the quantum effect is expressed, and, therefore, lower ends of conduction bands of silicon layers 26 and 28 rise by $\Delta E$ by the quantum containment effect of electrons. This lowers the tunneling probability of the stacked insulating layer 21. Consequently, caused by the presence of silicon layers 26 and 28, it is possible to suppress that electrons tend to leak easily from the FG electrode 14 to the CG electrode 16 via the charge storage layer 22. Consequently, the semiconductor memory device 1 has good data retention characteristic, too.

Further more, when data written in the memory cell transistor are to be erased, the potential of the active area 12 is set to be hither than the potential of the CG electrode 16. Consequently, electrons accumulated in the charge storage layer 22 are drawn out by the FG electrode 14 via the stacked insulating layer 21, and electrons accumulated in the FG electrode 14 is drawn out by the active area 12 via the tunnel insulating film 13. As the result, electrons having been accumulated in the charge storage layer 22 and the FG electrode 14 disappear and data are erased from the memory cell transistor.

On this occasion, in the same manner as the program operation described above, the silicon layer 28 provided on the charge storage layer 22 side in the stacked insulating layer 21 works as the relay part of electrons, and the tunneling current flowing through the stacked insulating layer 21 increases. Accordingly, the semiconductor memory device 1 has good data-erasing characteristics. Meanwhile, on this occasion, the application of erasing voltage lowers largely energy levels of the silicon layer 26 and the silicon oxide layer 25, and, therefore, the tunneling current flowing form the charge storage layer 22 toward the FG electrode 14 is scarcely influenced.

Meanwhile, as shown in FIGS. 10A and 10B, lower ends of conduction bands of silicon layers 26 and 28 rise by $\Delta E$ due to the confinement effect in the program operation and the erase operation, too, but, in the program operation and the erase operation, silicon layers 26 and 28 function as the relay part of electrons. Therefore, even when the lower end of the conduction band rises, the tunneling current substantially does not decrease.

Next, the effect of the embodiment will be described.

The semiconductor memory device 1 according to the embodiment can accumulate electrons for storing date in the charge storage layer 22, in addition to the floating gate electrode (FG electrode) 14. This can reduce the number of electrons to be accumulated in the FG electrode 14 among the number of electrons necessary for obtaining a prescribed threshold value. As the result, when electrons are retained, it is possible to reduce an electric field applied to the tunnel insulating film 13 caused by electrons accumulated in the FG electrode 14, and to suppress the leak of electrons from the FG electrode 14 to the active area 12 via the tunnel insulating film 13.

Meanwhile, the magnitude of the effect that electrons accumulated in the charge storage layer 22 give to the threshold value of the memory cell transistor depends on the interval between the active area 12 and the charge storage layer 22, and the smaller the interval, the larger the effect. Consequently, a thinner FG electrode 14 can give a larger influence on the threshold value. The thickness of the FG electrode 14 is preferably set to be equal to or less than the interval between adjacent FG electrodes 14. Consequently, the effect given by each of charge storage layers 22 to the active area 12 lying directly under them can be made larger than that given by adjacent charge storage layers 22. And, when the FG electrode 14 is made thinner, the coupling capacitance between adjacent FG electrodes 14 is reduced. Therefore, when the semiconductor memory device 1 is miniaturized, the interference between memory cell transistors can be suppressed.

Moreover, in the semiconductor memory device 1, as described above, since the silicon layer 26 is arranged in the stacked insulating layer 21, the application of program voltage to the stacked insulating layer 21 increases the tunneling probability. Consequently, the programming characteristics are good. Moreover, since the silicon layer 28 is arranged in the stacked insulating layer 21, the tunneling probability increases when the erasing voltage is applied to the stacked insulating layer 21. Therefore, the erasing characteristics are good. On the other hand, since lower ends of conduction bands of silicon layers 26 and 28 rise due to the quantum confinement effect, the tunneling probability of electrons lowers when voltage is not applied. Consequently, the deterioration of the electron retention characteristics due to the formation of silicon layers 26 and 28 can be suppressed. Meanwhile, it is considered to form an electron trapping layer in place of silicon layers 26 and 28 to relay the tunneling current, but, on this occasion, the charge retention characteristics when voltage is not applied are deteriorated.

Meanwhile, the thinner the thicknesses of silicon layers 26 and 28, the larger the quantum confinement effect and $\Delta E$. Thicknesses of silicon layers 26 and 28 that are 10 nm or less can give a certain effect. Moreover, when silicon layers 26 and 28 are constituted of silicon dots, the smaller the respective dots, the larger the quantum confinement effect and $\Delta E$. Thicknesses of silicon layers 26 and 28, and diameters of particles are more preferably 1 nm or less.

In order to form a state of relayed energy with silicon layers 26 and 28 when a prescribed electric field is applied, thicknesses of silicon oxide layers 25 and 29 must be thin to some degree. Moreover, in order to assure, too, the absolute amount of current flowing through the stacked insulating layer 21, thinner thicknesses of silicon oxide layers 25 and 29 are preferable. For example, when the intensity of the electric field applied to the stacked insulating layer 21 is 10 MV/cm, thicknesses of silicon oxide layers 25 and 29 are preferably 3 nm or less in order to obtain the effect resulted from the above-mentioned arrangement of silicon layers.

Hereinafter, the above-mentioned effect is described while citing specific experimental examples.

Figure 12:
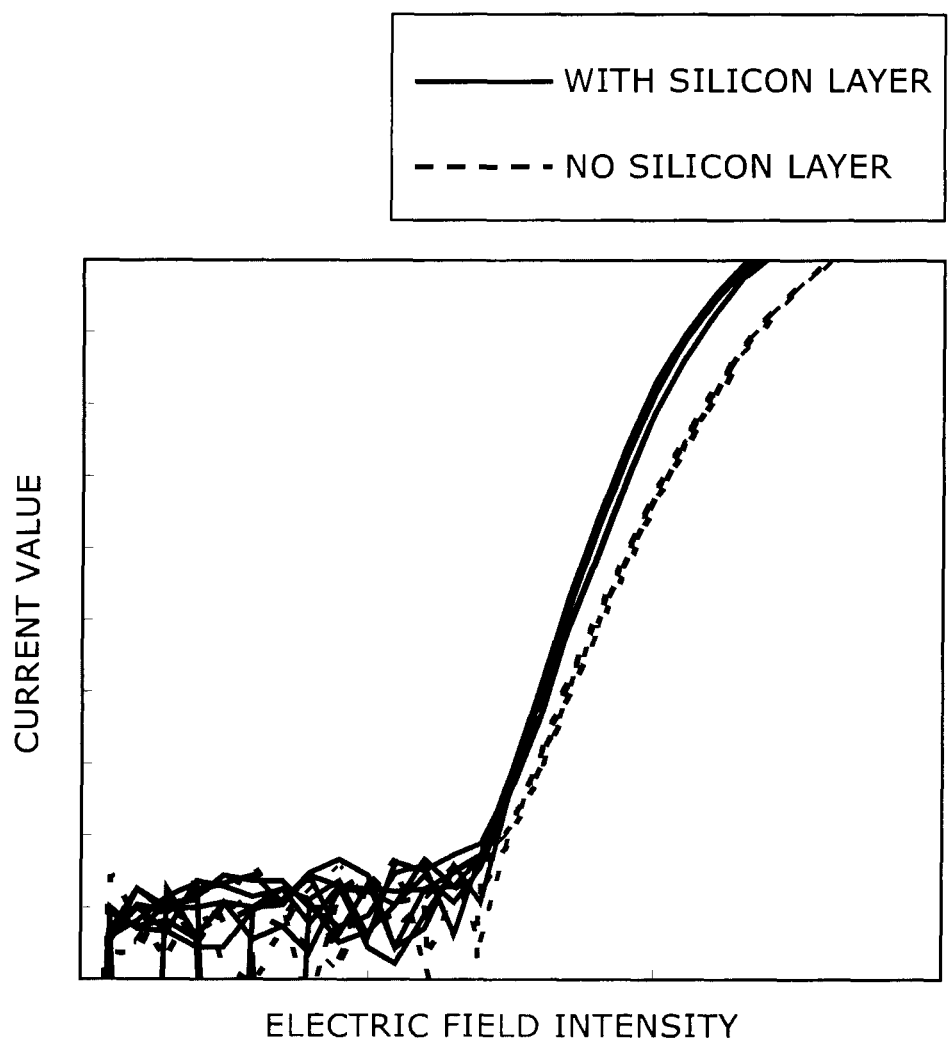
FIG. 12 is a graph illustrating a JE characteristic, having the electric field intensity as the horizontal axis and the current value as the vertical axis.

FIG. 12 is a graph chart illustrating a JE characteristic, having the electric field intensity as the horizontal axis and the current value as the vertical axis.

In the experimental example, four samples having a MIS (metal-insulator-semiconductor) structure were produced, in which an insulating film constituted of silicon oxide ($SiO_2$) was formed on a semiconductor substrate constituted of silicon, and a metal electrode was formed on the film. Of these, in two samples, a silicon layer that was thin to such a degree as could give the quantum effect was formed in the insulating film. In the remaining two samples, no silicon layer was formed in the insulating film. Then, to these samples, an electric field was applied from the semiconductor substrate side toward a direction in which electrons were injected. The electric field was gradually strengthened and the value of current flowing between the semiconductor substrate and the metal electrode was measured.

As shown in FIG. 12, in regions where the electric field intensity was relatively weak (low electric field region), the electric field intensity gave approximately the equal effect on the value of current. In contrast, in regions where the electric field intensity was relatively strong (high electric field region), samples having the silicon layer formed showed steeper rising of the JE curve than samples having no silicon layer, and a larger amount of the current. From the result, it is known that charge retention characteristics in low electric field regions are equal among samples, and that the injection efficiency of electrons in high electric field regions is higher in samples in which the silicon layer is provided.

Next, experimental examples using an actual semiconductor memory device will be described.

Figure 13A:
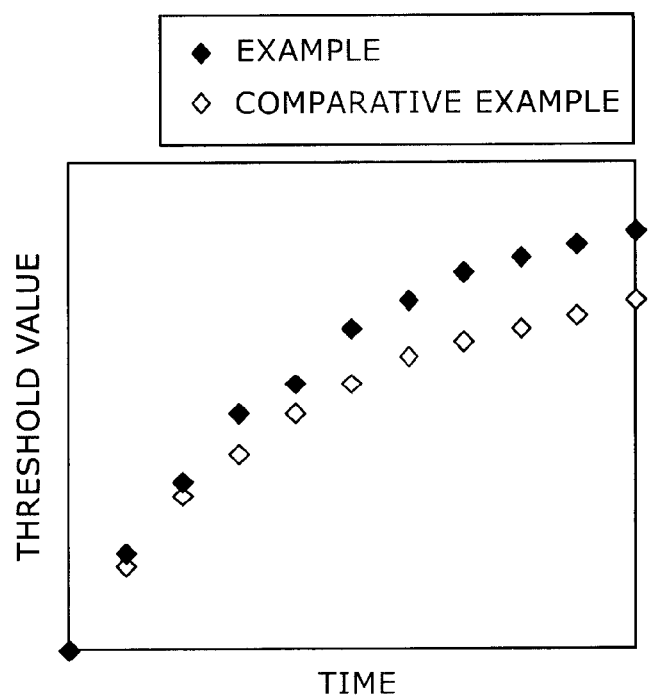
FIGS. 13A and 13B are graphs illustrating characteristics of the memory cell transistor, having the time as the horizontal axis and the threshold value as the vertical axis.
Figure 13B:
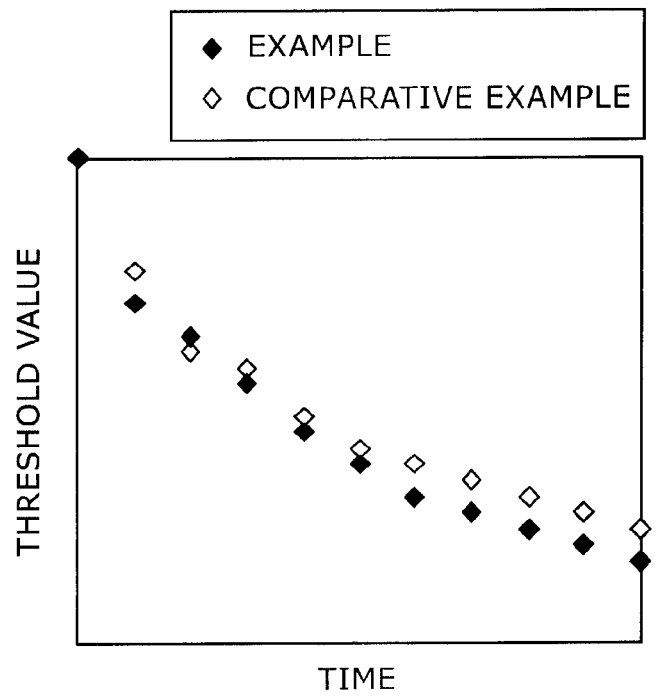

FIGS. 13A and 13B are graph illustrating characteristics of the memory cell transistor, having the time as the horizontal axis and the threshold value as the vertical axis, wherein 13A represents programming characteristics, and 13B represents erasing characteristics.

In the experimental example, the semiconductor memory device described in the first embodiment above-mentioned was produced, and was employed as "Example." Moreover, a device having neither a silicon layer 26 nor a layer 28 as compared with the semiconductor memory device according to the first embodiment was produced, and was employed as "Comparative Example."

As shown in FIGS. 13A and 13B, in the semiconductor memory device according to Example of the embodiment, both of the programming characteristics and the erasing characteristics were higher than those in the semiconductor memory device according to Comparative Example.

Next, a second embodiment will be described.

Figure 14:
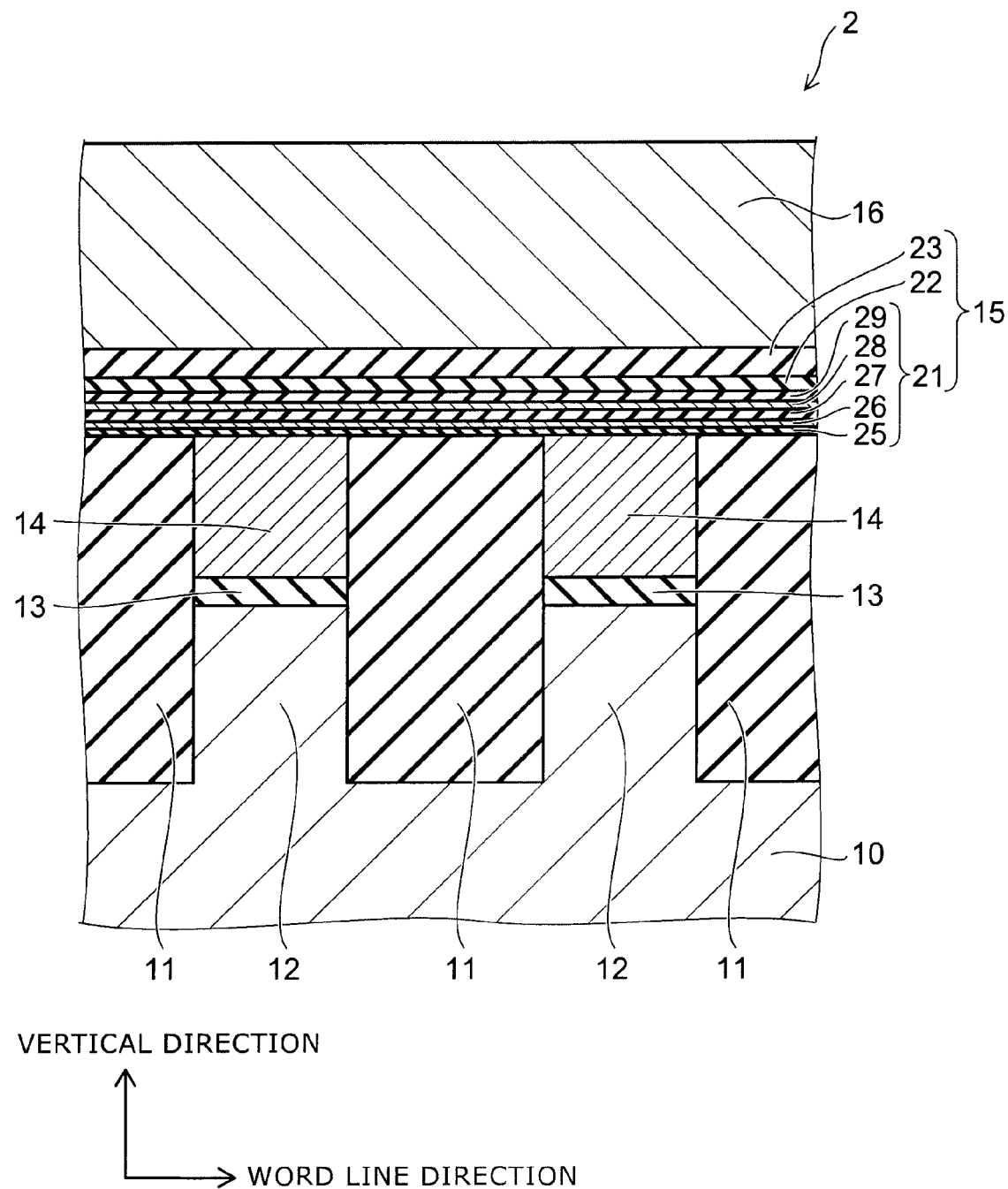
FIG. 14 is a cross-sectional view illustrating a semiconductor memory device according to a second embodiment.

FIG. 14 is a cross-sectional view illustrating a semiconductor memory device according to the embodiment.

As shown in FIG. 14, in a semiconductor memory device 2 according to the embodiment, the upper surface of the element isolation insulator 11 and the upper surface of the FG electrode 14 constitute approximately the same plane. Consequently, the interelectrode insulating film 15 has the shape of a flat belt extending in the word line direction, and the interelectrode insulating film 15 is arranged only in the upper portion of the FG electrode 14. The lower surface of the CG electrode 16 is also flat. Structures other than those above-mentioned, the manufacturing method, the operation and the effect in the embodiment are the same as those in the aforementioned first embodiment. That is, the embodiment, too, can give the same effect as that in the first embodiment.

For example, in aforementioned respective embodiments, examples are shown in which silicon oxide layers 25, 27 and 29 are formed by the ALD method, but the invention is not limited to this. For example, the silicon oxide layer may be formed by the LP-CVD method by reacting nitrous oxide ($N_2O$) at a temperature of around 800° C.

In respective embodiments above-mentioned, examples are shown, in which silicon layers 26 and 28 are formed by the LP-CVD method using silane as a raw material gas, but the invention is not limited to this. As the raw material gas, an inorganic source such as disilane or silicon chloride, or an organic source such as hydrocarbonated silane or aminosilane may be used. Or, to the above-mentioned silane-based gases, a nitrogen oxide gas such as nitrogen monoxide (NO), nitrogen dioxide ($NO_2$) or nitrous oxide ($N_2O$), or a hydrocarbon-based gas such as methane, ethane, ethylene or acetylene may be added. Consequently, the reaction product of these added gases works as a nucleus of the crystal growth of silicon, which can make crystalline particles in the silicon layer fine. Moreover, after the deposition of silicon, it may be annealed in a reductive atmosphere. This aggregates silicon to enable silicon dots to be formed.

Moreover, in aforementioned respective embodiments, examples were shown in which silicon layers 26 and 28 were formed in two positions of the lower side and the upper side of the stacked insulating layer 21, but the invention is not limited to this. The formation of the silicon layer in at least either one of these positions can improve at least one of the programming characteristics and the erasing characteristics.

Furthermore, in aforementioned respective embodiments, examples were shown in which the charge storage layer 22 was formed from silicon nitride, but the invention is not limited to this. The charge storage layer 22 may be a layer that has such ability as capable of capturing an electron. For example, it may be a single material layer constituted of one kind of material selected from the group consisting of silicon nitride, hafnium oxide, zirconium oxide and lanthanum oxide, a composite layer formed by stacking these single material layers, or a compound layer constituted of mixed crystal compounds of two or more kinds of materials selected from this group, or a silicate layer formed by adding silicon to above-mentioned single material layers, composite layers or compound layers.

Furthermore, in aforementioned respective embodiments, examples were shown in which the part of the stacked insulating layer 21 other than silicon layers 26 and 28, and the block insulating layer 23 were formed from silicon oxide, but the invention is not limited to this. A material having a barrier height that is higher than that of the charge storage layer 22 and having a little charge trap may be employed. For example, aluminum oxide, magnesium oxide, etc. can be used.

Furthermore, a silicon nitride layer may be formed as the uppermost layer and the lowermost layer of the interelectrode insulating film 15. That is, the interelectrode insulating film 15 may have a layer structure of an NONON structure, instead of the ONO structure. Furthermore, the formation of a thin silicon layer in the tunnel insulating film 13 can give the same effect as those in aforementioned respective embodiments.

The embodiments thus described can realize a semiconductor memory device having high programming/erasing characteristics and a high operation reliability, and the method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    a semiconductor substrate;
    a tunnel insulating film provided on the semiconductor substrate;
    a first electrode provided on the tunnel insulating film;
    an interelectrode insulating film provided on the first electrode; and
    a second electrode provided on the interelectrode insulating film,
    the interelectrode insulating film including
        a stacked insulating layer,
        a charge storage layer provided on the stacked insulating layer and having a lower barrier height than the stacked insulating layer, and
        a block insulating layer provided on the charge storage layer and having a higher barrier height than the charge storage layer, and
    the stacked insulating layer including
        a first insulating layer,
        a quantum effect layer provided on the first insulating layer and having a lower barrier height than the first insulating layer, and
        a second insulating layer provided on the quantum effect layer and having a higher barrier height than the quantum effect layer.

2. The device according to claim 1, wherein the first insulating layer and the second insulating layer are formed of silicon oxide, and the quantum effect layer is formed of silicon.

3. The device according to claim 1, wherein
    the stacked insulating layer further includes
        another quantum effect layer provided on the second insulating layer and having a lower barrier height than the second insulating layer, and
        a third insulating layer provided on the another quantum effect layer and having a higher barrier height than the other quantum effect layer.

4. The device according to claim 3, wherein the third insulating layer is formed of silicon oxide, and the another quantum effect layer is formed of silicon.

5. The device according to claim 3, wherein the first insulating layer and a second insulating layer are formed of silicon oxide, the quantum effect layer is formed of silicon, the third insulating layer is formed of silicon oxide, and the another quantum effect layer is formed of silicon.

6. The device according to claim 1, wherein the charge storage layer is a single material layer of one material selected from the group consisting of silicon nitride, hafnium oxide, zirconium oxide lanthanum oxide, or a composite layer formed by stacking the single material layer, or a compound layer of a mixed crystal compound of two or more materials selected from the group, or a silicate layer formed by adding silicon to the single material layer, the composite layer or the compound layer.

7. The device according to claim 1, wherein
    an upper layer part of the semiconductor substrate is partitioned into a plurality of parts in a line configuration extending in a first direction,
    the first electrode is arranged in regions directly above the parts in a line configuration along the first direction and along a second direction crossing the first direction in a matrix configuration, and
    the interelectrode insulating film and the second electrode extend in the second direction so as to connect regions directly above the first electrode.

8. A method for manufacturing a semiconductor memory device comprising: forming a stacked body of a tunnel insulating film, a first electrode, an interelectrode insulating film and a second electrode sequentially stacked on a semiconductor substrate,
    the forming the stacked body including
        forming a stacked insulating layer on the first electrode,
        forming a charge storage layer having a lower barrier height than the stacked insulating layer on the stacked insulating layer, and
        forming a block insulating layer having a higher barrier height than the charge storage layer on the charge storage layer, and
    the forming the stacked insulating layer including
        forming a first insulating layer on the first electrode,
        forming a quantum effect layer having a lower barrier height than the first insulating layer on the first insulating layer, and
        forming a second insulating layer having a higher barrier height than the quantum effect layer on the quantum effect layer.

9. The method according to claim 8, wherein the forming the first insulating layer includes depositing silicon oxide by an atomic layer deposition method.

10. The method according to claim 8, wherein the forming the quantum effect layer includes depositing silicon by a chemical vapor deposition method using silane or disilane as a raw material gas.

11. The method according to claim 10, wherein the forming the first insulating layer includes depositing silicon oxide by an atomic layer deposition method.

* * * * *